US009525389B2

(12) United States Patent
Hirooka

(10) Patent No.: US 9,525,389 B2
(45) Date of Patent: Dec. 20, 2016

(54) HIGH-FREQUENCY AMPLIFIER CIRCUIT

(71) Applicant: Murata Manufacturing Co., Ltd., Kyoto (JP)

(72) Inventor: Hiroyuki Hirooka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 14/746,896

(22) Filed: Jun. 23, 2015

(65) Prior Publication Data

US 2015/0295549 A1 Oct. 15, 2015

Related U.S. Application Data

(63) Continuation of application No. PCT/JP2013/079072, filed on Oct. 28, 2013.

(30) Foreign Application Priority Data

Dec. 26, 2012 (JP) ................................ 2012-282010

(51) Int. Cl.
*H03F 3/19* (2006.01)
*H03F 1/02* (2006.01)
(Continued)

(52) U.S. Cl.
CPC .............. *H03F 3/19* (2013.01); *H03F 1/0205* (2013.01); *H03F 1/0261* (2013.01); *H03F 1/56* (2013.01);
(Continued)

(58) Field of Classification Search
USPC ........................................ 330/285, 296, 289
See application file for complete search history.

(56) References Cited

U.S. PATENT DOCUMENTS 6,922,107 B1 * 7/2005 Green ..................... H03F 1/302 330/285
2002/0024390 A1 2/2002 Yamashita et al.
(Continued)

FOREIGN PATENT DOCUMENTS

JP H11-330866 A 11/1999
JP 2002-076791 A 3/2002
(Continued)

OTHER PUBLICATIONS

English translation of Written Opinion of the International Search Authority for Application No. PCT/JP2013/079072 dated Dec. 10, 2013.

(Continued)

*Primary Examiner* — Hieu Nguyen
(74) *Attorney, Agent, or Firm* — Pearne & Gordon LLP

(57) ABSTRACT

A high-frequency amplifier circuit (10) includes a high-frequency amplifier (101) and a bias circuit (20). The bias circuit (20) includes bias control elements (102, 103). An emitter of the bias control element (102) is connected to a base of the amplifier (101) via a resistor (201). An emitter of the bias control element (103) is connected to a collector of a switch element (104) via a resistor (203). The switch element (104) is a common emitter. A resistor (204) is connected between the emitter of the bias control element (102) and the emitter of the bias control element (103). A control voltage ($V_{CTL}$) is applied to bases of the bias control elements (102, 103). A bias current adjustment voltage ($V_{LIN}$) corresponding to an operation mode is applied to a base of the switch element (104).

19 Claims, 15 Drawing Sheets

(51) Int. Cl.
*H03F 1/56* (2006.01)
*H03F 3/191* (2006.01)

(52) U.S. Cl.
CPC ......... *H03F 3/191* (2013.01); *H03F 2200/135* (2013.01); *H03F 2200/18* (2013.01); *H03F 2200/222* (2013.01); *H03F 2200/387* (2013.01); *H03F 2200/411* (2013.01); *H03F 2200/451* (2013.01); *H03F 2200/555* (2013.01)

(56) References Cited

U.S. PATENT DOCUMENTS

2003/0016083 A1 1/2003 Joly et al.
2007/0222520 A1 9/2007 Inamori et al.

FOREIGN PATENT DOCUMENTS

JP 2004-537212 A 12/2004
JP 2007-258949 A 10/2007
JP 2009-118254 A 5/2009

OTHER PUBLICATIONS

English translation of International Search Report for Application No. PCT/JP2013/079072 dated Nov. 29, 2013.

* cited by examiner

HIGH-FREQUENCY AMPLIFIER CIRCUIT

BACKGROUND

Technical Field

The present disclosure relates to high-frequency amplifier circuits that amplify and then output an input high-frequency signal.

Background Art

A variety of high-frequency amplifier circuits are used in wireless communication terminals. Among such high-frequency amplifier circuits, there are high-frequency amplifier circuits configured to be able to change among a plurality of operation modes. For example, a high-frequency amplifier circuit as described in Patent Document 1 is used. FIG. 17 is a circuit diagram of a typical high-frequency amplifier circuit as described in Patent Document 1.

A high-frequency amplifier circuit 10P of the related art includes an amplifier 101 composed of an npn transistor and a bias determiner 20P. An emitter of the amplifier 101 is grounded. A base of the amplifier 101 is connected via an input matching circuit 901 to an RF input terminal Pin through which a high-frequency signal is input. A collector of the amplifier 101 is connected via an output matching circuit 902 to an RF output terminal Pout through which an amplified high-frequency signal is output.

The collector of the amplifier 101 is connected to a driving voltage application terminal $P_{VCC}$ via a coil 301 and a direct-current driving voltage $V_{CC}$ is applied to the collector of the amplifier 101 from the driving voltage application terminal $P_{VCC}$. A connection point between the driving voltage application terminal $P_{VCC}$ and the coil 301 is grounded by a capacitor 401.

The bias determiner 20P includes a bias control element 102 composed of an npn transistor. An emitter of the bias control element 102 is connected via a resistor 201 to the base of the amplifier 101 used for high-frequency amplification. A bias driving voltage application terminal $P_{VC0}$ is connected to a collector of the bias control element 102 and a direct-current bias driving voltage $V_{C0}$ is applied to the collector of the bias control element 102 from the bias driving voltage application terminal $P_{VC0}$.

A control voltage input terminal $P_{VCTL}$ is connected via a resistor 202 to a base of the bias control element 102 and a direct-current control voltage $V_{CTL}$ is applied to the base of the bias control element 102 from the control voltage input terminal $P_{VCTL}$.

In this high-frequency amplifier circuit 10P of the related art, a control voltage $V_{CTL}$ corresponding to an operation mode is applied to the base of the bias control element 102. In a low linearity mode, the control voltage $V_{CTL}$ is made low. As a result, a base current $I_{BB}$ supplied to the amplifier 101 used for high-frequency amplification from the bias control element 102 becomes low, the level of an output high-frequency signal can be lowered and power consumption can be suppressed. In a high linearity mode, the control voltage $V_{CTL}$ is made high. As a result, the base current $I_{BB}$ supplied to the amplifier 101 used for high-frequency amplification from the bias control element 102 can be made high and the level of an output high-frequency signal can be made high.

Patent Document 1: Japanese Unexamined Patent Application Publication No. 11-330866

BRIEF SUMMARY

However, in the high-frequency amplifier circuit 10P of the related art, when the base current $I_{BB}$ is lowered in the low linearity mode as described above, the level of the high-frequency signal is high compared to the base current $I_{BB}$ and the effect of the high-frequency signal on the bias control element 102 is increased. Therefore, the base current $I_{BB}$ supplied to the amplifier 101 used for high-frequency amplification is also affected by the high-frequency signal. As a result, an AM-AM characteristic and an EVM characteristic of the high-frequency amplifier circuit are degraded.

FIG. 18 illustrates a collector current characteristic with respect to output power of the high-frequency amplifier circuit of the related art. FIG. 19 illustrates an AM-AM characteristic with respect to output power of the high-frequency amplifier circuit of the related art. FIG. 20 illustrates an EVM characteristic with respect to output power of the high-frequency amplifier circuit of the related art. The AM-AM characteristic is an index indicating a phase change between input power and output power. EVM characteristic is an abbreviation of error vector magnitude characteristic and is an index indicating the performance of a demodulator under conditions where there is a problem.

As illustrated in FIG. 18, in the case of the low linearity mode, the collector current $I_{CC}$ is suppressed to be low compared with that in the high linearity mode.

However, as illustrated in FIG. 19 (referring to the portion indicated by the large arrow), the AM-AM characteristic deviates from 0 and the AM-AM characteristic is degraded in a medium power region of over 5 dBm. In accordance with this, as illustrated in FIG. 20 (refer to the portion indicated by the large arrow), the EVM characteristic also becomes higher than in the high linearity mode and is degraded.

Currently, in wireless communication, along with increasing amounts of data being transferred, many multi-value modulation methods are employed. However, as described above, in the case of the configuration of the high-frequency amplifier circuit 10P of the related art, the AM-AM characteristic and the EVM characteristic are degraded in the low linearity mode and a sufficient demodulation performance is not obtained.

The present disclosure provides a high-frequency amplifier circuit that suppresses degradation of an AM-AM characteristic and an EVM characteristic in a low linearity mode.

The present disclosure relates to a high-frequency amplifier circuit including a high-frequency amplifier that amplifies a high-frequency signal, a bias circuit that supplies a bias current to the high-frequency amplifier and a control voltage input terminal that determines the bias current. The bias circuit of the high-frequency amplifier circuit includes a 1st bias control element that supplies a 1st bias current to the high-frequency amplifier in accordance with the control voltage, a 2nd bias control element that supplies a 2nd bias current to the high-frequency amplifier in accordance with the control voltage, and a bias adjustment circuit that adjusts a potential difference between a 1st bias current output terminal of the 1st bias control element and a 2nd bias current output terminal of the 2nd bias control element.

With this configuration, the sizes of the 1st bias current and the 2nd bias current supplied to the high-frequency amplifier are adjusted by the bias adjustment circuit. Thus, a bias current corresponding to an operation mode can be supplied to the high-frequency amplifier. For example, in the case where a bias current is caused to increase to a certain extent in the low linearity mode, an unwanted increase in the bias current can be suppressed. Thus, an unwanted increase in a collector current $I_{CC}$ of the high-frequency amplifier can be suppressed and degradation of an AM-AM characteristic and an EVM characteristic can be suppressed.

Furthermore, the bias adjustment circuit of the high-frequency amplifier circuit of the present disclosure may have the following configuration. The bias adjustment circuit includes an impedance element, a switch circuit and a bias current adjustment voltage application terminal. The impedance element is connected between the 1st bias current output terminal of the 1st bias control element and the 2nd bias current output terminal of the 2nd bias control element. The switch circuit sets the 2nd bias current output terminal to either of a 1st potential and a 2nd potential, which are different from each other. The bias current adjustment voltage application terminal applies a bias current adjustment voltage to the switch circuit.

With this configuration, the switch circuit adjusts the potential of the 2nd bias current output terminal to the 1st potential or the 2nd potential in accordance with the bias current adjustment voltage. As a result of the potential of the output terminal of the 2nd bias current being adjusted, the potential difference between the 1st bias current output terminal and the 2nd bias current output terminal is changed and the bias current supplied to the high-frequency amplifier circuit is adjusted. Thus, the bias current can be adjusted with certainty and easily.

In addition, the switch circuit of the high-frequency amplifier circuit of the present disclosure may include a switch element that is controlled to be on or off in accordance with the bias current adjustment voltage from the bias current adjustment voltage application terminal.

With this configuration, the 1st potential and the 2nd potential are selectively set via the switch element being turned on and off. The bias current can be adjusted using a simpler circuit configuration.

Furthermore, the high-frequency amplifier circuit of the present disclosure may further include a control voltage synchronous adjustment circuit. The control voltage synchronous adjustment circuit adjusts an application voltage, which is based on the control voltage, applied to the 1st bias control element and the 2nd bias control element by using the bias current adjustment voltage.

With this configuration, biases of the 1st bias control element and the 2nd bias control element are also adjusted. Thus, the 1st bias current and the 2nd bias current are also adjusted and an unwanted increase in the bias currents can be suppressed with more certainty.

In addition, in the high-frequency amplifier circuit of the present disclosure, the high-frequency amplifier, the 1st bias control element, the 2nd bias control element and the switch element may be npn transistors.

In this configuration, each of the active elements is realized using the same type of semiconductor element. Thus, the high-frequency amplifier circuit can be realized using a simple structure while obtaining the above-described operational effect.

In addition, in the high-frequency amplifier circuit of the present disclosure, the high-frequency amplifier, the 1st bias control element and the 2nd bias control element may be npn transistors and the switch element may be a field effect transistor.

With this configuration as well, the high-frequency amplifier circuit can be realized using a comparatively simple structure while obtaining the above-described operational effect.

In addition, the impedance element of the high-frequency amplifier circuit of the present disclosure may be a resistor.

With this configuration, the high-frequency amplifier circuit can be realized with a simple configuration.

In addition, the impedance element of the high-frequency amplifier circuit of the present disclosure may be a parallel circuit composed of a resistor and a capacitor.

With this configuration, the size of the bias current flowing to the high-frequency amplifier can be further reduced and degradation of the AM-AM characteristic and the EVM characteristic can be further suppressed.

In addition, the high-frequency amplifier circuit of the present disclosure may further include a voltage compensation circuit that compensates an application voltage, which is based on the control voltage, applied to the 1st bias control element and the 2nd bias control element.

With this configuration, variation of the control voltage, temperature characteristics of the 1st and 2nd bias control elements and a temperature characteristic of the high-frequency amplifier can be compensated for. Thus, a high-frequency amplification characteristic is improved.

Furthermore, the voltage compensation circuit of the high-frequency amplifier circuit of the present disclosure may be composed of a plurality of compensation control elements cascade connected with each other between an application point of the control voltage of the 1st bias control element and the 2nd bias control element, and the ground.

With this configuration, voltage compensation can be realized with high accuracy and with a simple circuit configuration.

In addition, in the high-frequency amplifier circuit of the present disclosure, a parallel circuit composed of a capacitor and a resistor is connected to a side of a connection point between the high-frequency amplifier and the bias circuit from which a high-frequency signal is input.

With this configuration, the stability of the high-frequency amplifier circuit can be improved.

Furthermore, in the high-frequency amplifier circuit of the present disclosure, the high-frequency amplifier may be connected in a plurality of stages and the bias circuit may be formed for each of the plurality of stages of the high-frequency amplifier.

With this configuration, the above-described operational effect is obtained by each stage and therefore the effect of reducing power consumption can be more effectively exhibited without necessarily causing high-frequency characteristics such as the EVM characteristic to be degraded.

According to the present disclosure, degradation of the AM-AM characteristic and the EVM characteristic in the low linearity mode can be suppressed without necessarily affecting the characteristics of the high linearity mode.

BRIEF DESCRIPTION OF THE SEVERAL VIEWS OF THE DRAWINGS

A high-frequency amplifier circuit according to a 1st embodiment of the present disclosure will be described with reference to the drawings. FIG. 1 is a circuit diagram of a high-frequency amplifier circuit according to the 1st embodiment of the present disclosure.

Figure 1:
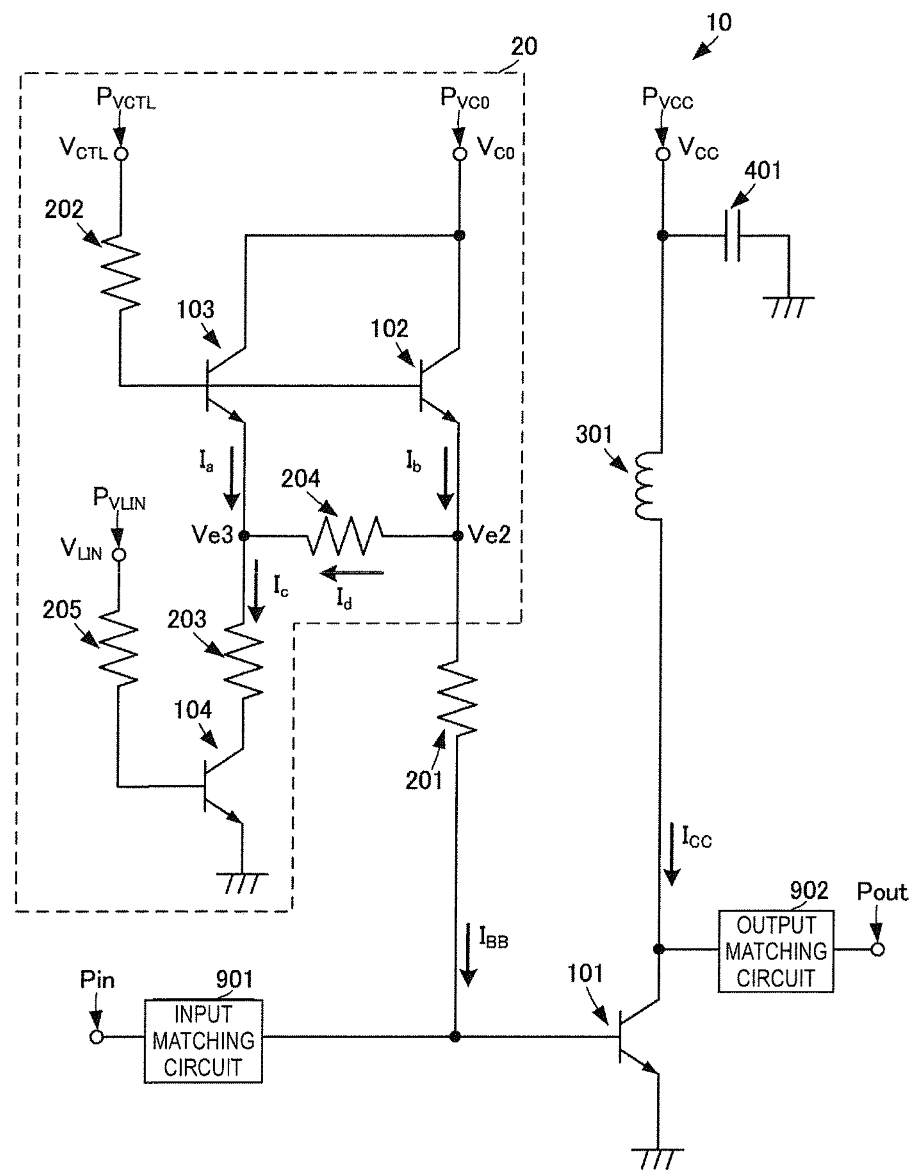
FIG. 1 is a circuit diagram of a high-frequency amplifier circuit according to a 1st embodiment of the present disclosure.

A high-frequency amplifier circuit 10 includes an amplifier 101 (corresponding to a high-frequency amplifier of the present disclosure) and a bias circuit 20. The amplifier 101 is composed of an npn transistor and is a common emitter. A base of the amplifier 101 is connected to an RF input terminal Pin via an input matching circuit 901. A collector of the amplifier 101 is connected to an RF output terminal Pout via an output matching circuit 902. A connection point between the collector of the amplifier 101 and the output matching circuit 902 is connected to a driving voltage application terminal $P_{VCC}$ via a coil 301. A connection point between the driving voltage application terminal $P_{VCC}$ and the coil 301 is grounded via a capacitor 401. A direct-current driving voltage $V_{CC}$ is applied to the collector of the amplifier 101 from the driving voltage application terminal $P_{VCC}$.

The bias determiner 20 includes bias control elements 102 and 103 and a switch element 104. The bias control elements 102 and 103 and the switch element 104 are each composed of an npn transistor. The bias control element 102 corresponds to a "1st bias control element" of the present disclosure and the bias control element 103 corresponds to a "2nd bias control element" of the present disclosure.

An emitter of the bias control element 102 is connected to the base of the amplifier 101 via a resistor 201. The emitter of the bias control element 102 corresponds to a "1st bias current output terminal" of the present disclosure.

A collector of the bias control element 102 is connected to a bias driving voltage application terminal $P_{VC0}$. A direct-current bias driving voltage $V_{C0}$ is applied to the collector of the bias control element 102 from the bias driving voltage application terminal $P_{VC0}$.

In addition, the bias driving voltage application terminal $P_{VC0}$ is also connected to a collector of the bias control element 103 and the direct-current bias driving voltage $V_{C0}$ is also applied to the collector of the bias control element 103 from the bias driving voltage application terminal $P_{VC0}$.

Bases of the bias control elements 102 and 103 are connected to a control voltage input terminal $P_{VCTL}$ via a resistor 202. A direct-current control voltage $V_{CTL}$ is applied to the bases of the bias control elements 102 and 103 from the control voltage input terminal $P_{VCTL}$.

An emitter of the bias control element 103 is connected to a collector of the switch element 104 via a resistor 203. In addition, the emitter of the bias control element 103 is connected to the emitter of the bias control element 102 via a resistor 204. The emitter of the bias control element 103 corresponds to a "2nd bias current output terminal" of the present disclosure.

The switch element 104 is a common emitter. A base of the switch element 104 is connected to a bias current adjustment voltage application terminal $P_{VLIN}$ via a resistor 205. A direct-current bias current adjustment voltage $V_{LIN}$ is applied to the base of the switch element 104 from the bias current adjustment voltage application terminal $P_{VLIN}$. A circuit composed of the switch element 104 and the resistors 203 and 205 corresponds to a "switch circuit" of the present disclosure. A circuit composed of the switch element 104 and the resistors 203, 204 and 205 corresponds to a "bias adjustment circuit" of the present disclosure.

In the high-frequency amplifier configured as described above, a high-frequency signal input from the RF input terminal Pin is amplified by the amplifier 101 and output from the RF output terminal Pout. At this time, the output of the amplifier 101 corresponds to the bias current $I_{BB}$ supplied from the bias circuit 20. Therefore, by adjusting the bias current $I_{BB}$, amplification processing, that is, an operation mode of the amplifier 101 can be switched.

(i) High Linearity Mode

Figure 2:
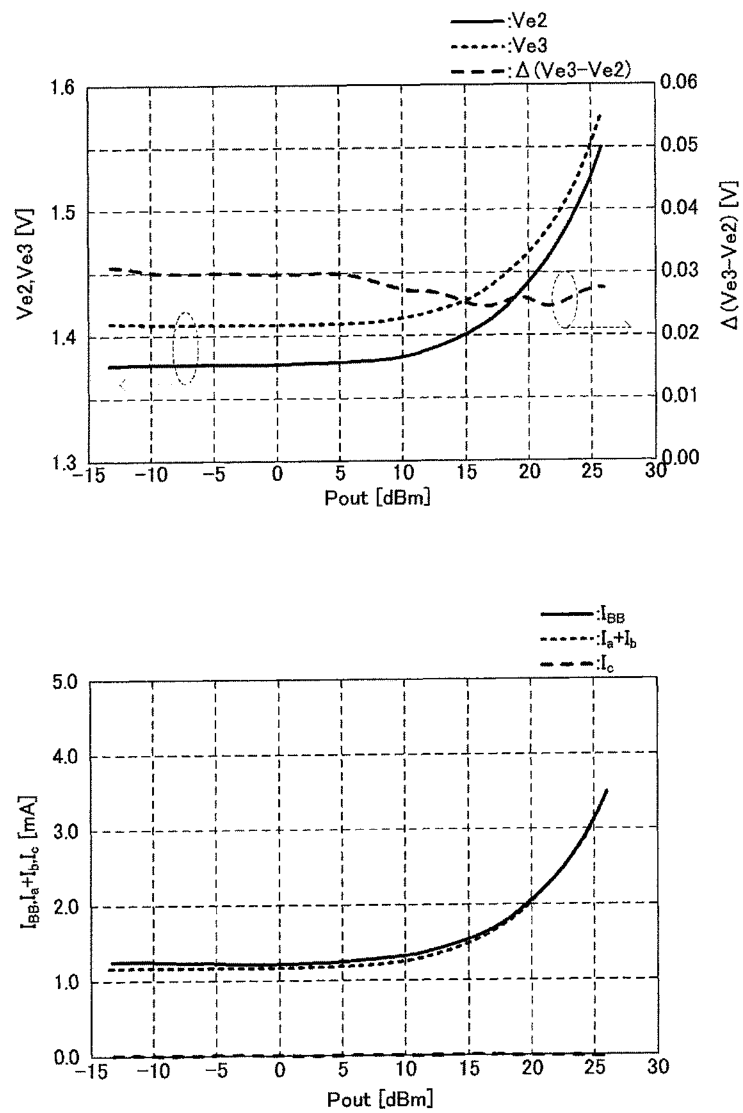
FIG. 2 illustrates characteristics of emitter voltages Ve2 and Ve3 and an emitter potential difference Δ (Ve3−Ve2) with respect to output power Pout at the time of a high linearity mode and illustrates characteristics of a bias current $I_{BB}$ and partial currents Ia+Ib and Ic with respect to output power Pout.

FIG. 2 illustrates characteristics of an emitter voltage Ve2 of the bias control element 102, an emitter voltage Ve3 of the bias control element 103 and an emitter potential difference Δ (Ve3−Ve2) with respect to output power Pout at the time of a high linearity mode and illustrates characteristics of the bias current $I_{BB}$ and partial currents Ia+Ib and Ic with respect to output power Pout.

In the case of the high linearity mode, the bias current adjustment voltage $V_{LIN}$ is set to be a voltage that is less than an operation threshold of the switch element 104. In this case, the switch element 104 is in an off state and an end of the resistor 203 on the switch element 104 side is in a state of not being connected to ground. In this state, the control voltage $V_{CTL}$ is applied to the bases of the bias control elements 102 and 103 from the control voltage input terminal $P_{VCTL}$ and the bias driving voltage $V_{C0}$ is applied to the collectors of the bias control elements 102 and 103 from the bias driving voltage application terminal $P_{VC0}$. Thus, an emitter current Ib corresponding to the control voltage $V_{CTL}$ flows through the emitter of the bias control element 102 and an emitter current Ia corresponding to the control voltage $V_{CTL}$ flows through the emitter of the bias control element 103.

Here, as described above, the end of the resistor 203 on the switch element 104 side is disconnected from ground and therefore a partial current Ic is approximately 0 and the emitter voltage Ve3 of the bias control element 103 is maintained higher than the emitter voltage Ve2 of the bias control element 102. On the other hand, since the emitter of the bias control element 102 is grounded via the resistor 201 and the amplifier 101, the emitter voltage Ve2 is a voltage corresponding to the voltages dropped across these elements. Therefore, as illustrated in FIG. 2, an emitter potential difference Δ (Ve3−Ve2) between the bias control element 103 and the bias control element 102 has a positive value regardless of the output power Pout at the time of the high linearity mode.

Since the emitter of the bias control element 103 is open, the emitter current Ia thereof flows through the resistor 204 but does not flow through the resistor 203. That is, as illustrated in FIG. 2, the partial current Ic flowing to the resistor 203 is approximately 0.

Thus, the emitter current Ia flows toward the bias control element 102 side from the bias control element 103 side via the resistor 204. For example, as illustrated in FIG. 1, if a current flowing from the emitter of the bias control element 102 toward the emitter of the bias control element 103 is set to be Id, Ia=−Id.

Therefore, the bias current $I_{BB}$ flowing through the resistor 201 connected between the emitter of the bias control element 102 and the base of the amplifier 101 is Ib−(Id) =Ib+Ia (refer to bottom part of FIG. 2). Consequently, the emitter current Ib from the bias control element 102 and the emitter current Ia from the bias control element 103 are added together and supplied to the base of the amplifier 101 as the bias current $I_{BB}$.

Thus, at the time of the high linearity mode, the bias current $I_{BB}$ is supplied to the amplifier 101 without necessarily being suppressed.

(ii) Low Linearity Mode

Figure 3:
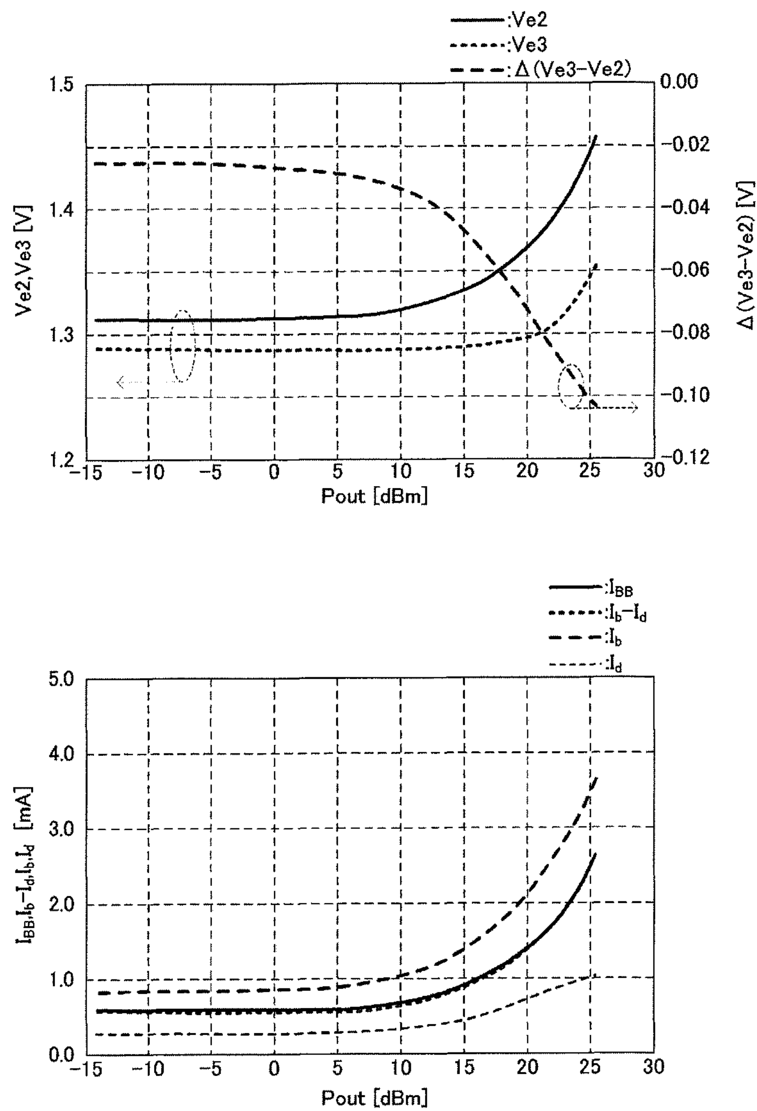
FIG. 3 illustrates characteristics of the emitter voltages Ve2 and Ve3 and the emitter potential difference Δ (Ve3−Ve2) with respect to output power Pout at the time of a low linearity mode and illustrates characteristics of the bias current $I_{BB}$ and the partial currents Ib−Id, Ib and Id with respect to output power Pout.

FIG. 3 illustrates characteristics of the emitter voltages Ve2 and Ve3 and the emitter potential difference Δ (Ve3−Ve2) with respect to output power Pout at the time of a low linearity mode and illustrates characteristics of the bias current $I_{BB}$ and the partial currents Ib−Id, Ib and Id with respect to output power Pout.

In the case of the low linearity mode, the bias current adjustment voltage $V_{LIN}$ is set to be a voltage that is equal to or greater than the operation threshold of the switch element 104. In this case, the switch element 104 is in an on state and the end of the resistor 203 on the switch element 104 side is connected to ground. In this state, the control voltage $V_{CTL}$ is applied to the bases of the bias control elements 102 and 103 from the control voltage input terminal $P_{VCTL}$ and the bias driving voltage $V_{C0}$ is applied to the collectors of the bias control elements 102 and 103 from the bias driving voltage application terminal $P_{VC0}$. Thus, an emitter current Ib corresponding to the control voltage $V_{CTL}$ flows through the emitter of the bias control element 102 and an emitter current Ia corresponding to the control voltage $V_{CTL}$ flows through the emitter of the bias control element 103.

Here, as described above, an end portion on the switch element 104 side connected to the resistor 203 is short circuited with the ground and therefore the emitter voltage Ve3 of the bias control element 103 drops so as to approach the ground potential. On the other hand, since the emitter of the bias control element 102 is grounded via the resistor 201 and the amplifier 101, the emitter voltage Ve2 is a voltage corresponding to the voltages dropped across these elements. Consequently, the emitter voltage Ve3 is lower than the emitter voltage Ve2. Therefore, as illustrated in FIG. 3, an emitter potential difference Δ (Ve3−Ve2) between the bias control element 103 and the bias control element 102 has a negative value regardless of the output power Pout at the time of the low linearity mode.

Therefore, the emitter current Ia flows through the resistor 203 and does not flow through the resistor 204. In addition, part of the emitter current Ib also flows toward the bias control element 103 side from the bias control element 102 side via the resistor 204. That is, the emitter current Ib branches between the resistor 201 and the resistor 204. If this branch current component is denoted Idb, Id=Idb.

Therefore, the bias current $I_{BB}$ flowing through the resistor 201 connected between the emitter of the bias control element 102 and the base of the amplifier 101 is Ib−(Id) =Ib−Idb. Thus, a current obtained by subtracting the current Idb branching to the resistor 204 from the emitter current Ib from the bias control element 102 is supplied as the bias current $I_{BB}$ to the base of the amplifier 101.

At this time, part of the high-frequency signal (RF signal) input from the RF input terminal Pin is input to the bias circuit 20 via the resistor 201. Here, the emitter potential difference Δ (Ve3−Ve2) between the bias control element 103 and the bias control element 102 has a negative value and the emitter voltage Ve2 is higher than the emitter voltage Ve3.

Consequently, the high-frequency signal flows to ground via the resistor 204, the resistor 203 and the switch element 104. Thus, the high-frequency signal flowing into the bias control elements 102 and 103 can be suppressed and an adverse effect of the high-frequency signal on the bias current $I_{BB}$ can be suppressed. Therefore, the AM-AM characteristic and the EVM characteristic of the high-frequency amplifier circuit 10 are improved.

In addition, with the above-described configuration, at the time of the low linearity mode, the bias current $I_{BB}$ is suppressed compared with that in the configuration of the related art and then supplied to the amplifier 101.

(Comparison of Characteristics Between Configuration of Related Art and Configuration of this Embodiment)

Figure 4:
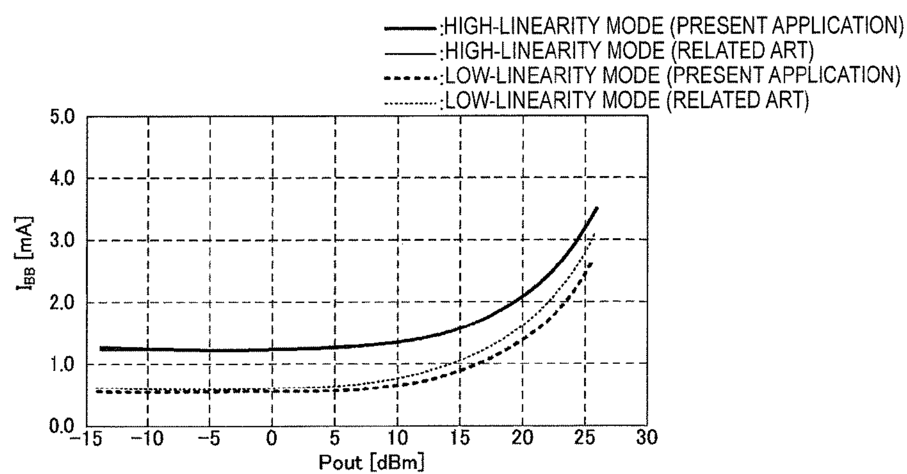
FIG. 4 illustrates a characteristic of a bias current $I_{BB}$ with respect to output power Pout for a configuration of the related art and a configuration of the 1st embodiment.

FIG. 4 illustrates a characteristic of a bias current $I_{BB}$ with respect to output power Pout for the configuration of the related art and the configuration of the 1st embodiment. In the high linearity mode, as illustrated in FIG. 4, the same bias current $I_{BB}$ as in the configuration of the related art can be supplied to the amplifier 101 by using the configuration of this embodiment. In addition, in the low linearity mode, as illustrated in FIG. 4, the bias current $I_{BB}$ can be reduced from that in the configuration of the related art by using the configuration of this embodiment.

Figure 5:
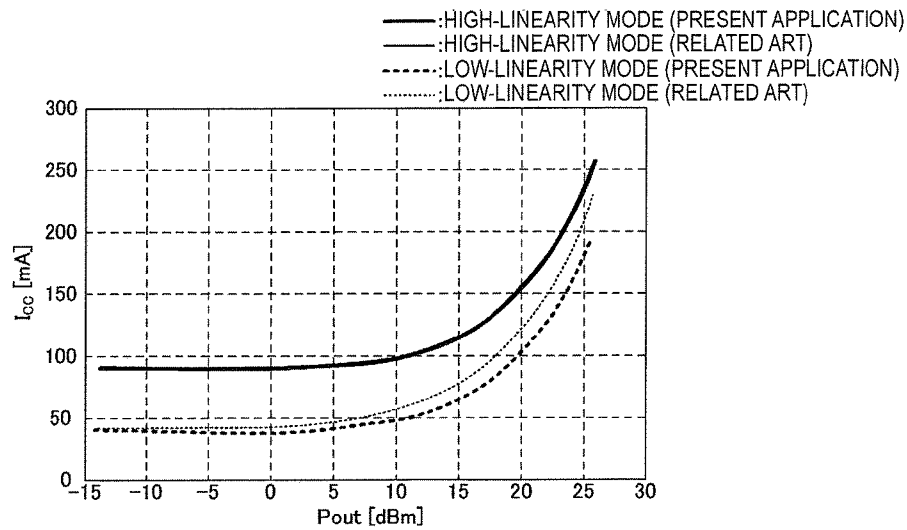
FIG. 5 illustrates a characteristic of a collector current $I_{CC}$ of a high-frequency amplifier with respect to output power Pout for the configuration of the related art and the configuration of the 1st embodiment.

FIG. 5 illustrates a characteristic of a collector current $I_{CC}$ of a high-frequency amplifier with respect to output power Pout for the configuration of the related art and the configuration of the 1st embodiment. In the high linearity mode, since the same bias current $I_{BB}$ as in the configuration of the related art is supplied by using the configuration of this embodiment, as illustrated in FIG. 5, the same collector current $I_{CC}$ as in the configuration of the related art can be obtained. In addition, in the low linearity mode, since a bias current $I_{BB}$ that has been suppressed compared with that in the configuration of the related art is supplied by using the configuration of this embodiment, as illustrated in FIG. 5, the collector current $I_{CC}$ can be reduced compared with that in the configuration of the related art.

Figure 6:
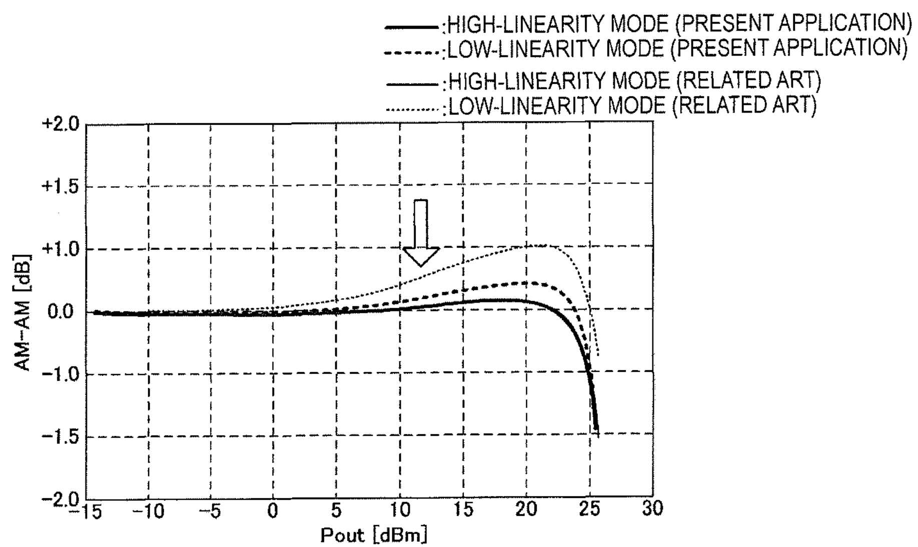
FIG. 6 illustrates an AM-AM characteristic with respect to output power Pout for the configuration of the related art and the configuration of the 1st embodiment.

FIG. 6 illustrates an AM-AM characteristic with respect to output power Pout for the configuration of the related art and the configuration of the 1st embodiment. In the high linearity mode, since the same collector current $I_{CC}$ as in the configuration of the related art is obtained by using the configuration of this embodiment, as illustrated in FIG. 6, an excellent AM-AM characteristic can be obtained similarly to as in the configuration of the related art. In addition, in the low linearity mode, by using the configuration of this embodiment, the collector current $I_{CC}$ can be suppressed compared with that in the configuration of the related art, in particular, the collector current $I_{CC}$ in a power region of 5 dBm or more can be suppressed, and a high-frequency signal that has entered the bias circuit 20 flows toward the resistor 203 side and as a result the effect of the high-frequency signal on the bias circuit 20 can be suppressed, and therefore, as illustrated in FIG. 6, the AM-AM characteristic can be improved compared with that in the configuration of the related art. In particular, the AM-AM characteristic in the medium power region can be improved.

Figure 7:
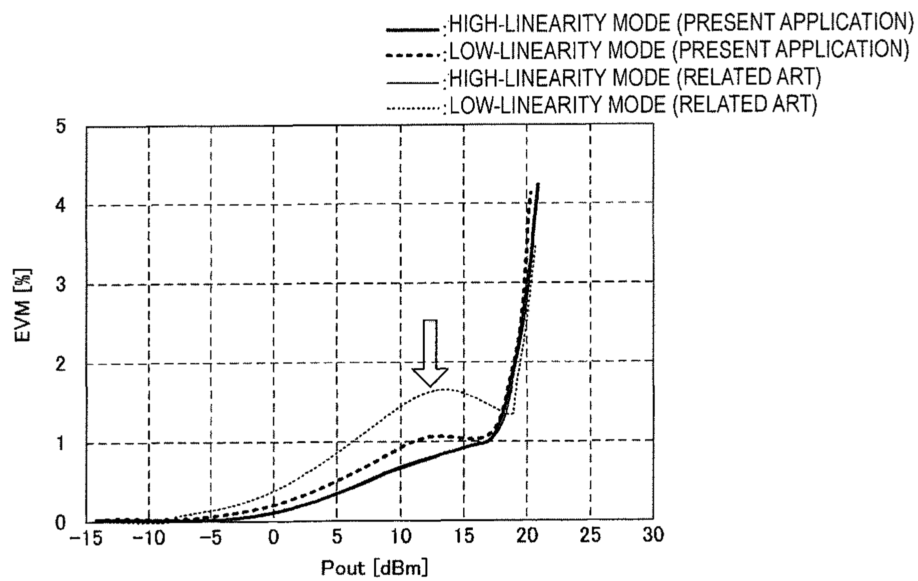
FIG. 7 illustrates an EVM characteristic with respect to output power Pout for the configuration of the related art and the configuration of the 1st embodiment.

FIG. 7 illustrates an EVM characteristic with respect to output power Pout for the configuration of the related art and the configuration of the 1st embodiment. In the high linearity mode, since the same collector current $I_{CC}$ as in the configuration of the related art is obtained by using the configuration of this embodiment, as illustrated in FIG. 7, an excellent EVM characteristic can be obtained similarly to as in the configuration of the related art. In addition, in the low linearity mode, by using the configuration of this embodiment, the collector current $I_{CC}$ can be suppressed compared with that in the configuration of the related art, in particular, the collector current $I_{CC}$ in a power region of 5 dBm or more can be suppressed, and a high-frequency signal that has entered the bias circuit 20 flows toward the resistor 203 side and as a result the effect of the high-frequency signal on the bias circuit 20 can be suppressed and therefore, as illustrated in FIG. 7, the EVM characteristic can be improved compared with that in the configuration of the related art. In particular, the EVM characteristic can be improved in the medium power region.

As described above, by using the high-frequency amplifier circuit of this embodiment, degradation of the AM-AM characteristic and the EVM characteristic in the low linearity mode can be suppressed thereby improving the characteristics without necessarily affecting the characteristics of the high linearity mode.

Figure 8:
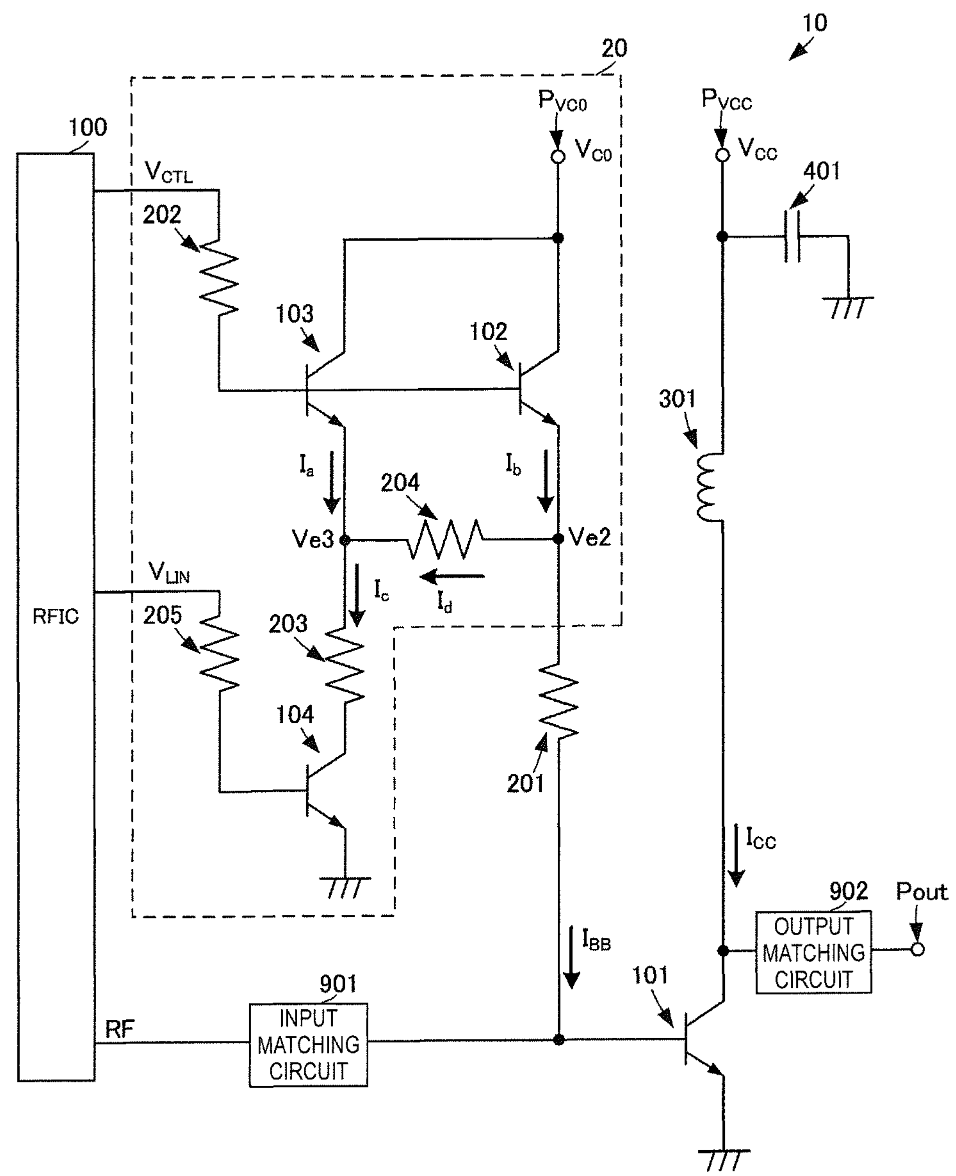
FIG. 8 is a circuit diagram of a composite module composed of an RFIC and a high-frequency amplifier circuit.

In the above-described FIG. 1, an example in which the RF input terminal Pin, the control voltage input terminal $P_{VCTL}$ and the bias current adjustment voltage application terminal $P_{VLIN}$ are provided is illustrated, but the configuration illustrated in FIG. 8 may be instead employed. FIG. 8 is a circuit diagram of a composite module composed of an RFIC and a high-frequency amplifier circuit.

The RF input terminal Pin, the control voltage input terminal $P_{VCTL}$ and the bias current adjustment voltage application terminal $P_{VLIN}$ of the high-frequency amplifier circuit 10 become output terminals of an RFIC 100.

The RFIC 100 generates the control voltage $V_{CTL}$, the bias current adjustment voltage $V_{LIN}$ and the high-frequency signal RF. The RFIC 100 applies the control voltage $V_{CTL}$ to the bias control elements 102 and 103 via the resistor 202. The RFIC 100 applies the bias current adjustment voltage $V_{LIN}$ to the switch element 104 via the resistor 205. At this time, the RFIC 100 sets and then applies the bias current adjustment voltage $V_{LIN}$ in accordance with the operation mode. The RFIC 100 inputs the high-frequency signal RF to the amplifier 101 via the input matching circuit 901.

Figure 9:
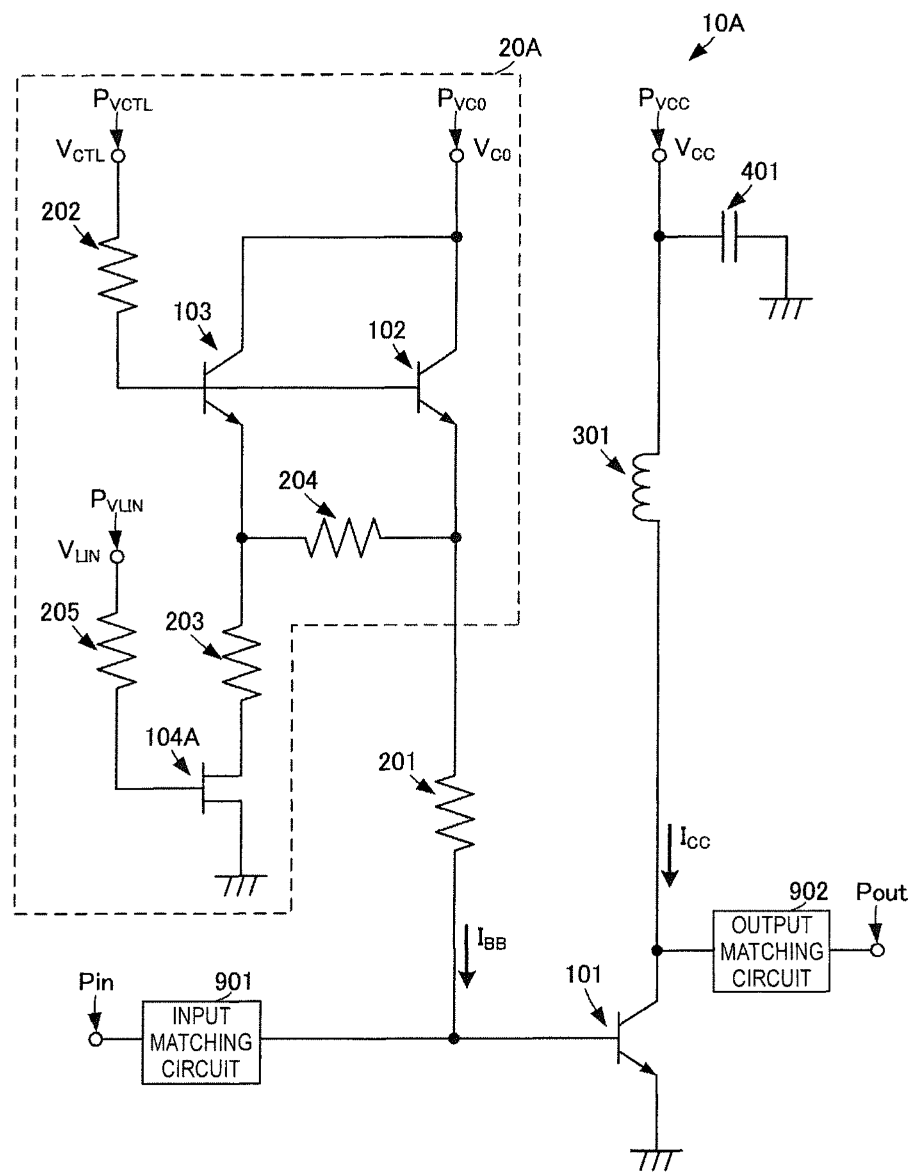
FIG. 9 is a circuit diagram of a high-frequency amplifier circuit according to a 2nd embodiment of the present disclosure.

Next, a high-frequency amplifier circuit according to a 2nd embodiment will be described with reference to the drawings. FIG. 9 is a circuit diagram of the high-frequency amplifier circuit according to the 2nd embodiment of the present disclosure. A switch element of a bias circuit 20A of a high-frequency amplifier circuit 10A of this embodiment differs from that of the high-frequency amplifier circuit 10 according to the 1st embodiment, but the rest of the configuration of the high-frequency amplifier circuit 10A is the same as that of the high-frequency amplifier circuit 10 according to the 1st embodiment. In this embodiment and the following embodiments, only places that are different to the embodiment that is the target of comparison will be described.

A switch element 14A of the bias circuit 20A of this embodiment is composed of a field effect transistor (FET). The bias current adjustment voltage application terminal $P_{VLIN}$ is set based on a threshold voltage of the FET. Therefore, an operational effect the same as that of the high-frequency amplifier circuit 10 of the 1st embodiment can be obtained when the high-frequency amplifier circuit 10A of this embodiment is used.

Figure 10:
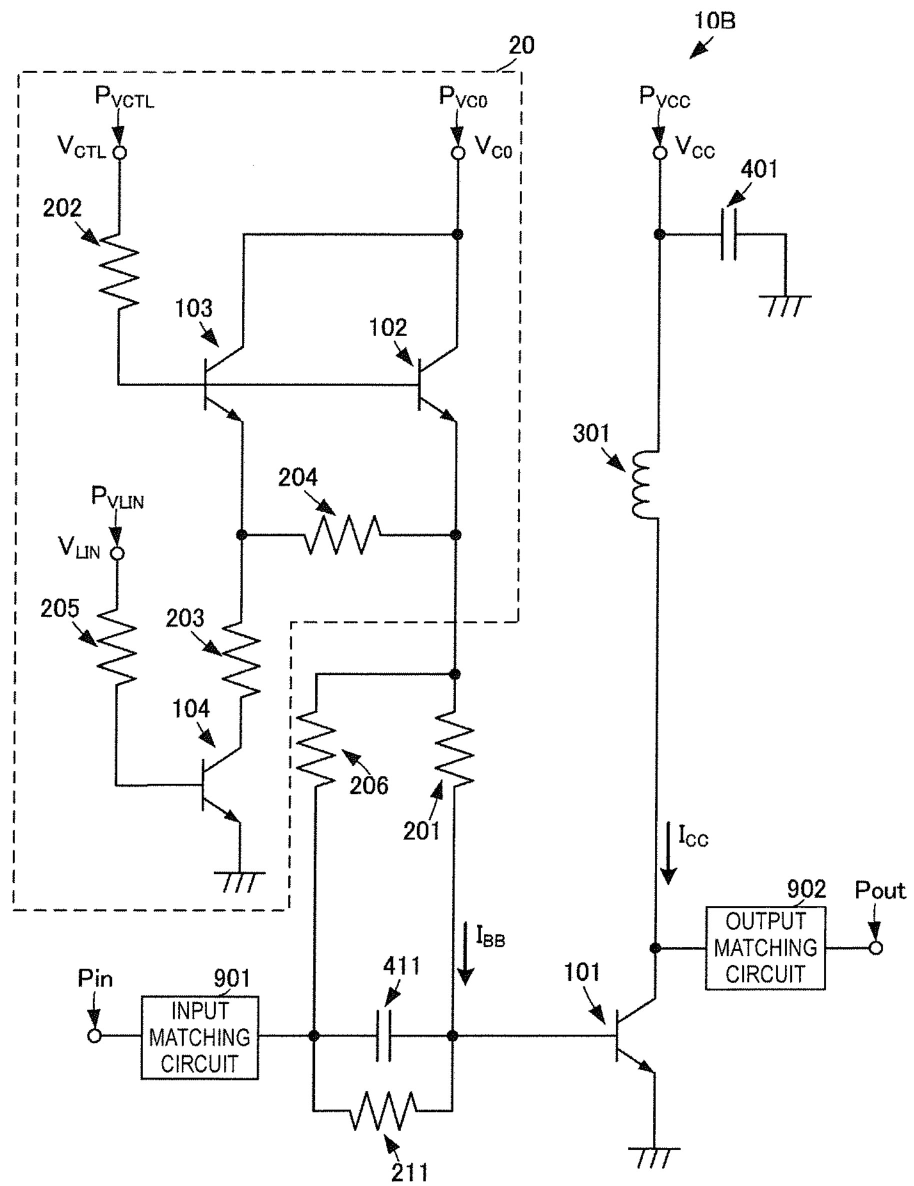
FIG. 10 is a circuit diagram of a high-frequency amplifier circuit according to a 3rd embodiment of the present disclosure.

Next, a high-frequency amplifier circuit according to a 3rd embodiment will be described with reference to the drawings. FIG. 10 is a circuit diagram of the high-frequency amplifier circuit according to the 3rd embodiment of the present disclosure. The connection configuration between the input matching circuit 901 and the amplifier 101 and the connection configuration with respect to the bias circuit 20 of the high-frequency amplifier circuit 10A of this embodiment differ from those of the high-frequency amplifier circuit 10 according to the 1st embodiment but the rest of the configuration of the high-frequency amplifier circuit 10A is the same as that of the high-frequency amplifier circuit 10 according to the 1st embodiment.

A parallel circuit composed of a capacitor 411 and a resistor 211 is connected between the input matching circuit 901 and the amplifier 101 of the high-frequency amplifier circuit 10B. The amplifier 101 side of the parallel circuit is connected to the resistor 201 connected to the bias circuit 20. In addition, the input matching circuit 901 side of the parallel circuit is connected to the emitter of the bias control element 102 of the bias circuit 20 via a resistor 206.

With this configuration, the same operational effect as with the above-described embodiments is obtained, and in addition the high-frequency amplifier circuit 10B can be prevented from oscillating with more certainty since a stability coefficient of the high-frequency amplifier circuit 10B can be adjusted by using the added circuit. Thus, the stability of the high-frequency amplifier circuit 10B can be improved.

Figure 11:
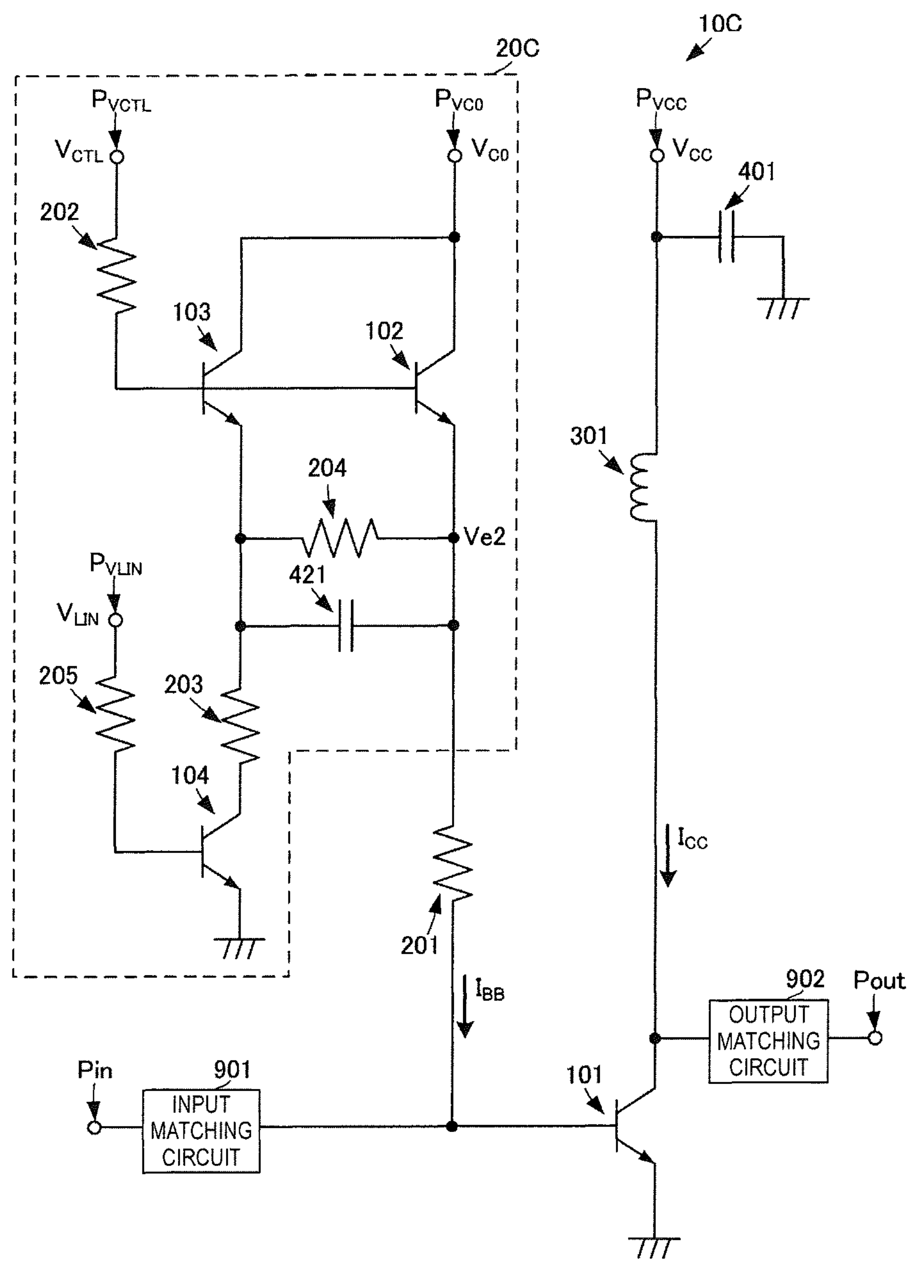
FIG. 11 is a circuit diagram of a high-frequency amplifier circuit according to a 4th embodiment of the present disclosure.

Next, a high-frequency amplifier circuit according to a 4th embodiment will be described with reference to the drawings. FIG. 11 is a circuit diagram of the high-frequency amplifier circuit according to the 4th embodiment of the present disclosure. The configuration of a bias circuit 20C of a high-frequency amplifier circuit 10C of this embodiment differs from that of the high-frequency amplifier circuit 10 according to the 1st embodiment, but the rest of the configuration of the high-frequency amplifier circuit 10C is the same as that of the high-frequency amplifier circuit 10 according to the 1st embodiment.

The bias circuit 20C is obtained by adding a capacitor 421 to the bias circuit 20 according to the 1st embodiment. The capacitor 421 is connected in parallel with the resistor 204. That is, the emitter of the bias control element 103 and the emitter of the bias control element 102 are connected to each other by a parallel circuit composed of the resistor 204 and the capacitor 421.

Figure 12:
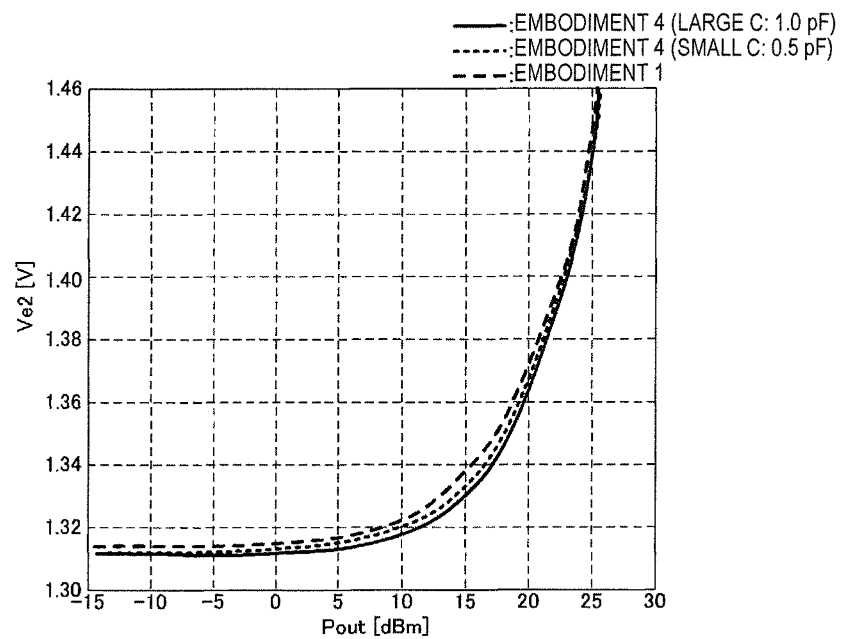
FIG. 12 compares an emitter voltage Ve2 with respect to output voltage Pout at the time of a low linearity mode of the high-frequency amplifier circuit of the 4th embodiment with an emitter voltage Ve2 with respect to output voltage Pout at the time of a low linearity mode of the high-frequency amplifier circuit of the 1st embodiment.

FIG. 12 compares the emitter voltage Ve2 with respect to output voltage Pout at the time of a low linearity mode of the high-frequency amplifier circuit of the 4th embodiment with the emitter voltage Ve2 with respect to output voltage Pout at the time of a low linearity mode of the high-frequency amplifier circuit of the 1st embodiment. In FIG. 12 and the later-mentioned FIG. 13, a case of a large capacitance of 10 pF and a case of a small capacitance of 0.5 pF are illustrated.

By providing the capacitor 421 as in this embodiment, the emitter voltage Ve2 of the bias control element 102 at the time of the low linearity mode can be reduced. At this time, the amount of reduction of the emitter voltage Ve2 can be adjusted by adjusting the capacitance of the capacitor 421. Specifically, as illustrated in FIG. 12, the emitter voltage Ve2 can be reduced by a greater amount by making the capacitance of the capacitor 421 larger.

Figure 13:
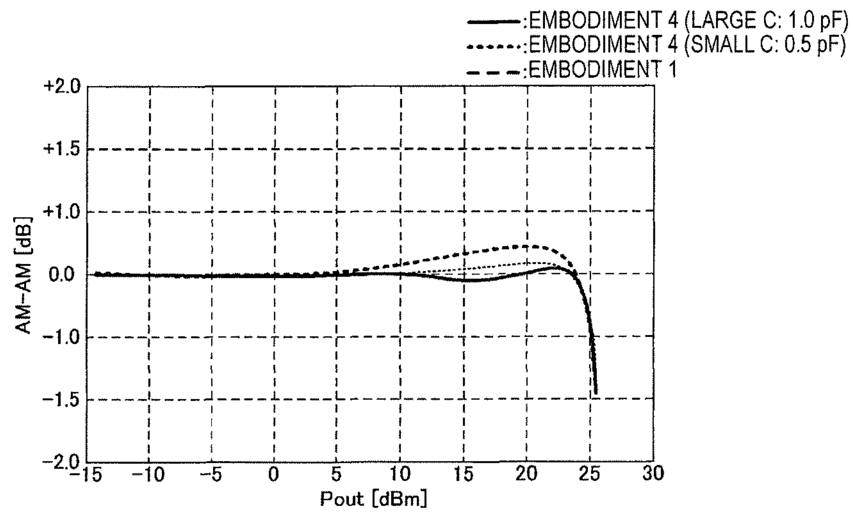
FIG. 13 compares an AM-AM characteristic with respect to output voltage Pout at the time of a low linearity mode of the high-frequency amplifier circuit of the 4th embodiment with an AM-AM characteristic with respect to output voltage Pout at the time of a low linearity mode of the high-frequency amplifier circuit of the 1st embodiment.

FIG. 13 compares an AM-AM characteristic with respect to output voltage Pout at the time of a low linearity mode of the high-frequency amplifier circuit of the 4th embodiment with an AM-AM characteristic with respect to output voltage Pout at the time of a low linearity mode of the high-frequency amplifier circuit of the 1st embodiment.

By providing the capacitor 421 as in this embodiment, the AM-AM characteristic of the bias control element 102 at the time of the low linearity mode can be adjusted. Specifically, as illustrated in FIG. 13, by making the capacitance of the capacitor 421 large, the AM-AM characteristic in a medium power region can be shifted toward the negative value side and therefore the AM-AM characteristic can be appropriately adjusted by adjusting the capacitance of the capacitor 421.

Thus, by using the configuration of this embodiment, a more optimum AM-AM characteristic can be obtained by appropriately adjusting the AM-AM characteristic. Thus, the EVM characteristic can be further improved.

Figure 14:
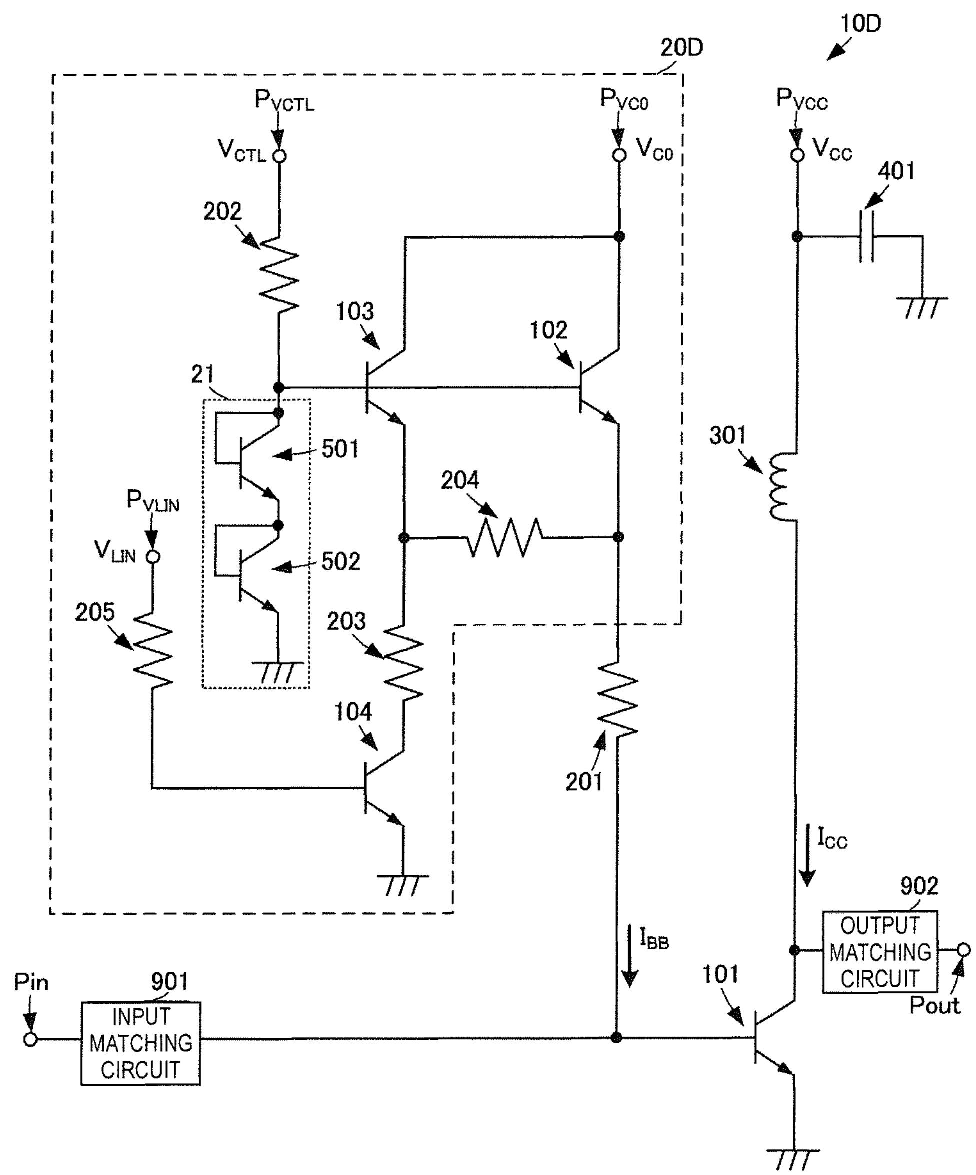
FIG. 14 is a circuit diagram of a high-frequency amplifier circuit according to a 5th embodiment of the present disclosure.

Next, a high-frequency amplifier circuit according to a 5th embodiment will be described with reference to the drawings. FIG. 14 is a circuit diagram of the high-frequency amplifier circuit according to the 5th embodiment of the present disclosure. The configuration of a bias circuit 20D of a high-frequency amplifier circuit 10D of this embodiment differs from that of the high-frequency amplifier circuit 10 according to the 1st embodiment, but the rest of the configuration of the high-frequency amplifier circuit 10D is the same as that of the high-frequency amplifier circuit 10 according to the 1st embodiment.

The bias circuit 20D of the high-frequency amplifier circuit 10D is obtained by adding a voltage compensation circuit 21 to the bias circuit 20. The voltage compensation circuit 21 is composed of compensation control elements 501 and 502, which are cascade connected with each other. The compensation control elements 501 and 502 are composed of npn transistors, the same the amplifier 101 and the bias control elements 102 and 103. As a more specific configuration of the control voltage adjustment circuit 21, a collector of the compensation control element 501 is connected to the bases of the bias control elements 102 and 103. The compensation control element 501 has its collector connected to its own base (that of compensation control element 501). An emitter of the compensation control element 501 is connected to a collector of the compensation control element 502. The compensation control element 502 has its collector connected to its own base (that of compensation control element 502). The compensation control element 502 is a common emitter.

When a voltage value of the control voltage $V_{CTL}$ from the control voltage input terminal $P_{VCTL}$ becomes high and the base voltages of the bias control elements 102 and 103 attempt to rise, a current that simultaneously flows into the voltage compensation circuit 21 configured as described above increases. Thus, a voltage dropped across the resistor 202 increases and therefore the increases of the base voltages are compensated for and the base voltages are maintained constant. On the other hand, when the voltage value of the control voltage $V_{CTL}$ from the control voltage input terminal $P_{VCTL}$ becomes low and the base voltages of the bias control elements 102 and 103 attempt to fall, a current simultaneously flowing into the voltage compensation circuit 21 decreases. Thus, a voltage dropped across the resistor 202 decreases and therefore the decreases of the base voltages are compensated for and the base voltages are maintained constant. In addition, there is an effect from the temperature characteristics of the amplifier 101 and the bias control elements 102 and 103, and it is considered that even though the control voltage $V_{CTL}$ is constant, an amplification characteristic changes. However, temperature compensation can be performed by providing the voltage compensation circuit 21.

Figure 15:
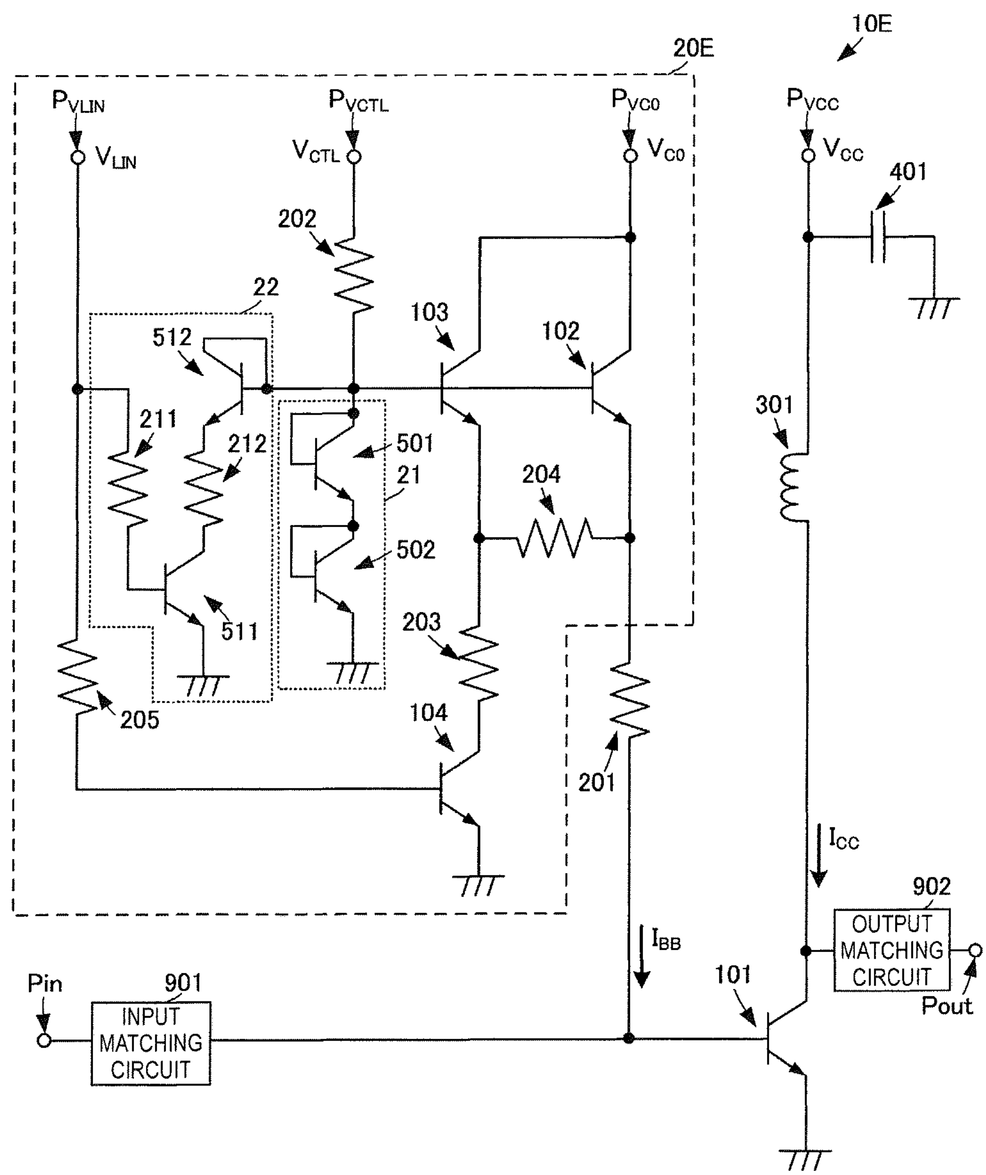
FIG. 15 is a circuit diagram of a high-frequency amplifier circuit according to a 6th embodiment of the present disclosure.

Next, a high-frequency amplifier circuit according to a 6th embodiment will be described with reference to the drawings. FIG. 15 is a circuit diagram of the high-frequency amplifier circuit according to the 6th embodiment of the present disclosure. The configuration of a bias circuit 20E of a high-frequency amplifier circuit 10E of this embodiment differs from that of the high-frequency amplifier circuit 10D according to the 5th embodiment, but the rest of the configuration of the high-frequency amplifier circuit 10E is the same as that of the high-frequency amplifier circuit 10D according to the 5th embodiment.

The control bias adjustment circuit 20E of the high-frequency amplifier circuit 10E is obtained by adding a control voltage synchronous adjustment circuit 22 to the bias circuit 20D of the high-frequency amplifier circuit 10D. The control voltage synchronous adjustment circuit 22 includes tuning control elements 511 and 512 and resistors 211 and 212. The tuning control elements 511 and 512 are composed of npn transistors.

The tuning control element 511 is a common emitter and its base is connected to the bias current adjustment voltage $V_{LIN}$ via the resistor 211. A collector of the tuning control element 511 is connected to an emitter of the tuning control element 512 via the resistor 212. The tuning control element 512 has its base connected to the bases of the bias control elements 102 and 103 and to its own collector (that of tuning control element 512). The tuning control element 511 has the same characteristics as the switch element 104 and is arranged close thereto. With this configuration, the following operations occur at the times of the respective operation modes.

(At Time of High Linearity Mode)

At the time of the high linearity mode, the bias current adjustment voltage $V_{LIN}$ is set to be less than a threshold voltage of the switch element 104. Therefore, the bias current adjustment voltage $V_{LIN}$ is less than a threshold voltage of the tuning control element 511 and the tuning control element 511 is in an off state. Thus, an emitter voltage of the tuning control element 512 is high and base voltages of the bias control elements 102 and 103 are also maintained high. Therefore, a current corresponding to the control voltage $V_{CTL}$ is supplied to the bias control elements 102 and 103 and the bias current $I_{BB}$ to the amplifier 101 can also be maintained high.

(At Time of Low Linearity Mode)

At the time of the low linearity mode, the bias current adjustment voltage $V_{LIN}$ is set to be equal to or more than the threshold voltage of the switch element 104. Therefore, the bias current adjustment voltage $V_{LIN}$ is equal to or more than the threshold voltage of the tuning control element 511 and the tuning control element 511 is in an on state. Thus, the emitter of the tuning control element 512 is connected to the ground via the resistor 212 and the emitter voltage becomes low. As a result of the emitter voltage of the tuning control element 512 decreasing, part of the current corresponding to the control voltage $V_{CTL}$ flows into the control voltage synchronous adjustment circuit 22 and the base currents of the bias control elements 102 and 103 decrease. Therefore, the bias current $I_{BB}$ to the amplifier 101 supplied from the bias control elements 102 and 103 is suppressed. Thus, power consumption is further decreased and compared with the configuration of the 1st embodiment the two necessary control terminals can be unified into a single control terminal.

Figure 16:
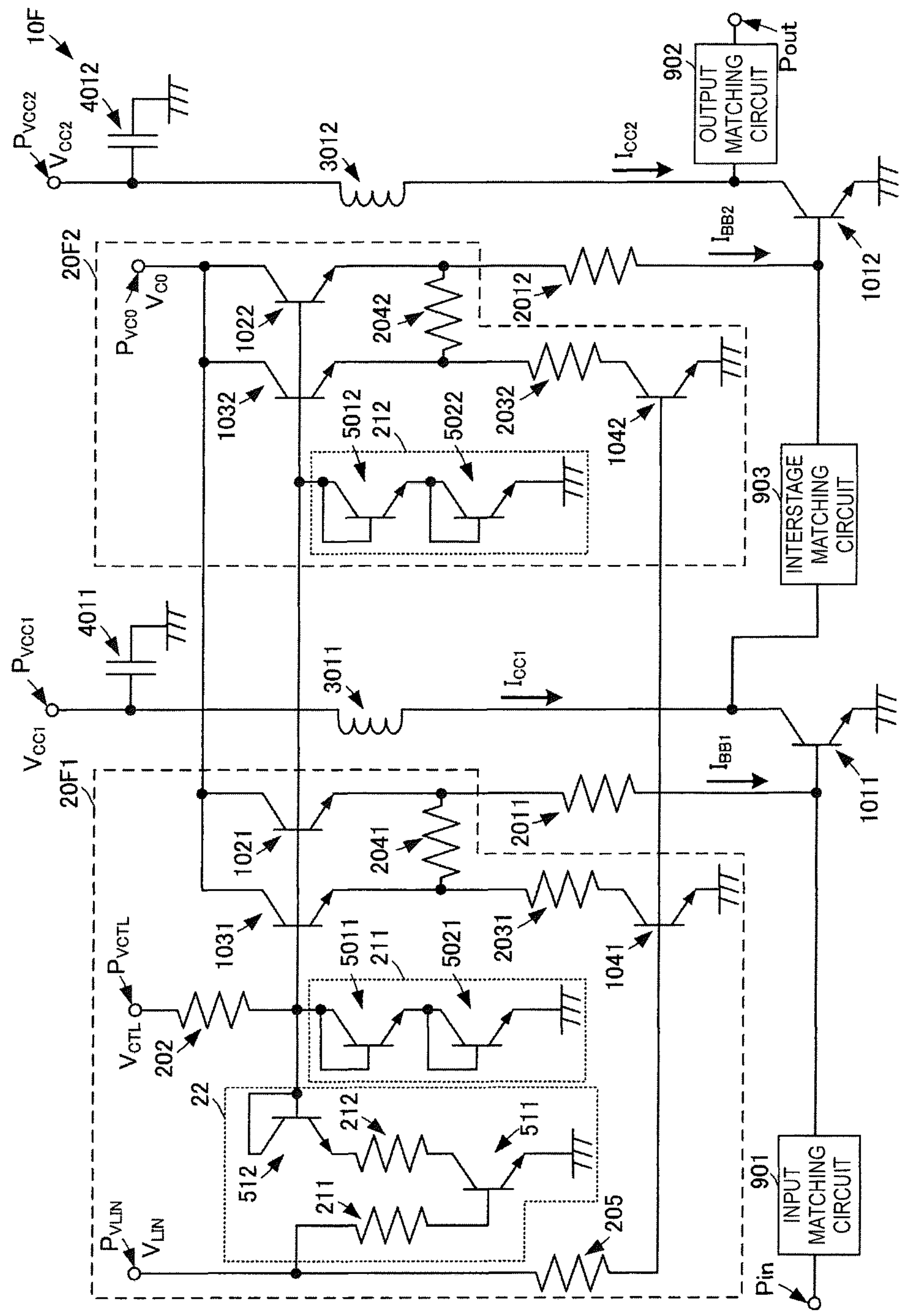
FIG. 16 is a circuit diagram of a high-frequency amplifier circuit according to a 7th embodiment of the present disclosure.
Figure 17:
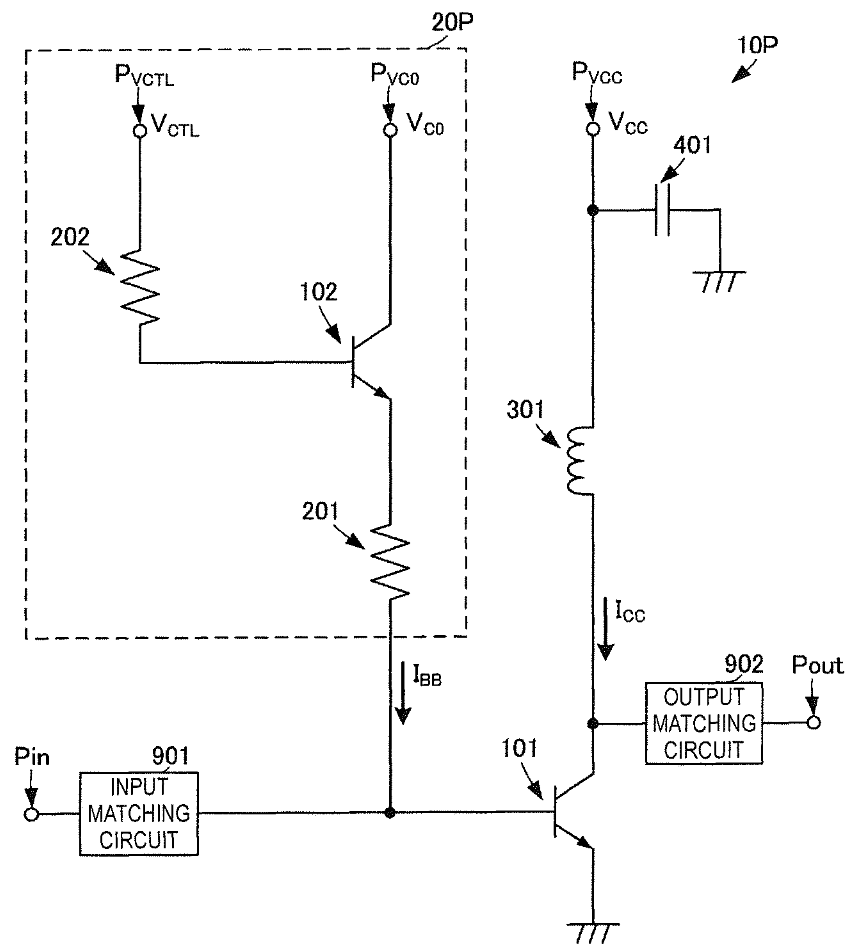
FIG. 17 is a circuit diagram of a typical high-frequency amplifier circuit of the related art.
Figure 18:
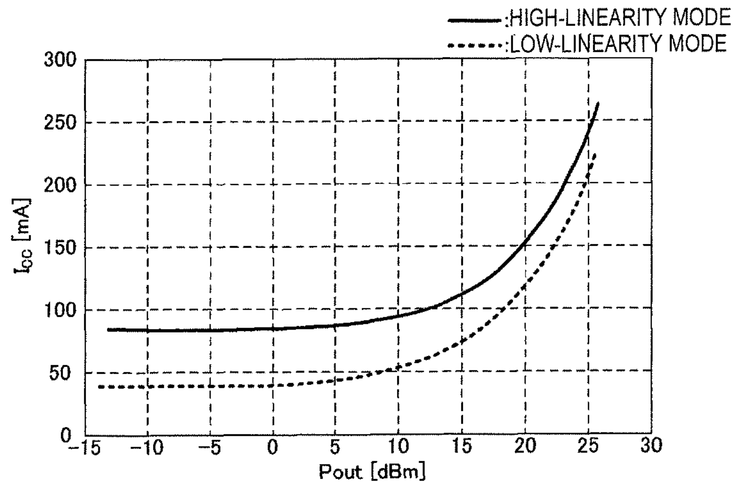
FIG. 18 illustrates a characteristic of a collector current with respect to output power of the high-frequency amplifier circuit of the related art.
Figure 19:
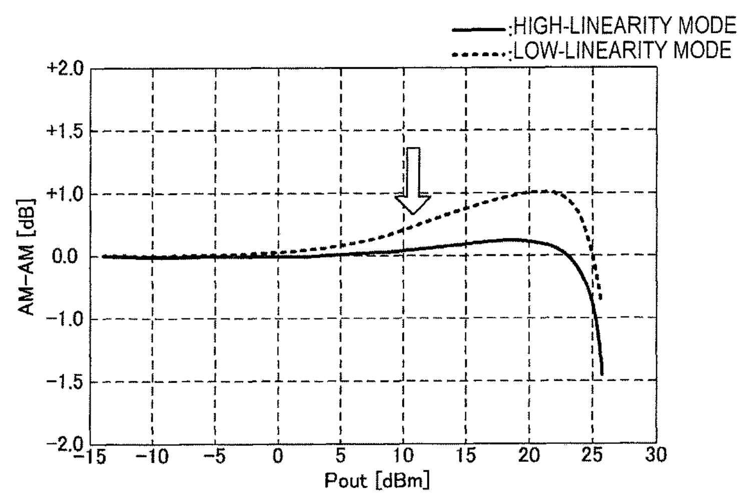
FIG. 19 illustrates an AM-AM characteristic with respect to output power of the high-frequency amplifier circuit of the related art.
Figure 20:
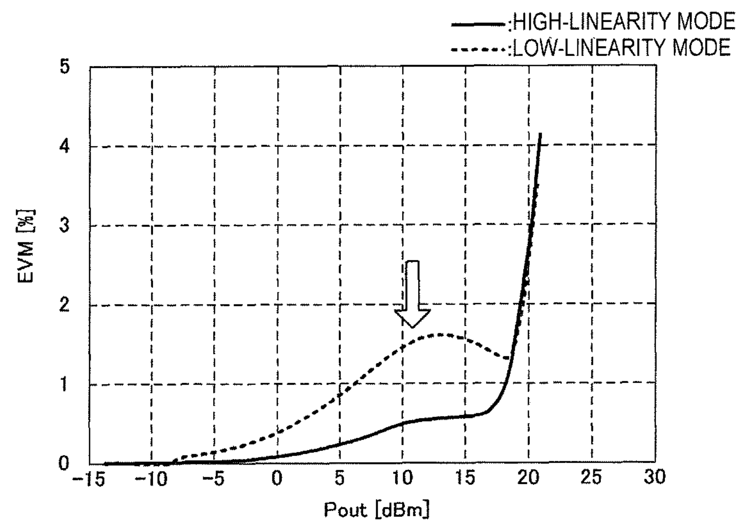
FIG. 20 illustrates an EVM characteristic with respect to output power of the high-frequency amplifier circuit of the related art.

Next, a high-frequency amplifier circuit according to a 7th embodiment will be described with reference to the drawings. FIG. 16 is a circuit diagram of the high-frequency amplifier circuit according to the 7th embodiment of the present disclosure. A high-frequency amplification amplifier of a high-frequency amplifier circuit 10F of this embodiment has a two-stage configuration and the basic configuration of the bias circuit for each stage of the amplifier is the same as that described in the above-described embodiments.

The high-frequency amplifier circuit 10F includes high-frequency amplification amplifiers 1011 and 1012. The amplifiers 1011 and 1012 are composed of npn transistors. Emitters of the amplifiers 1011 and 1012 are grounded. A base of the amplifier 1011 is connected to the RF input terminal Pin via the input matching circuit 901. A collector of the amplifier 1011 is connected to a base of the amplifier 1012 via an interstage matching circuit 903. The collector of the bias control element 102 is connected to the RF output terminal Pout via the output matching circuit 902.

A bias current $I_{BB1}$ is supplied from a bias circuit 20F1 to the amplifier 1011. A bias current $I_{BB2}$ is supplied from a bias circuit 20F2 to the amplifier 1012. The bias circuits 20F1 and 20F2 have the same basic configuration as the bias circuit 20E according to the above-described 6th embodiment, but the bias driving voltage application terminal $P_{VC0}$, the control voltage input terminal $P_{VCTL}$, the bias current adjustment voltage application terminal $P_{VLIN}$, the resistor 205 and the control voltage synchronous adjustment circuit 22 are shared therebetween.

The same operational effect as in each of the above-described embodiments can also be obtained with this configuration. In addition, the amplification factor of the high-frequency amplifier circuit can be improved as a result of the high frequency amplification amplifier being connected in two stages. In particular, the amplification factor at the time of the high linearity mode can be improved. On the other hand, since the power consumption of each stage can be suppressed, the power consumption of the high-frequency amplifier circuit can be more effectively reduced.

An example of two stages is described in this embodiment, but a configuration with more stages may be adopted.

In addition, the configurations of the above-described embodiments may be combined with each other. For example, the configuration of the 2nd embodiment and the configuration of the 3rd embodiment may be combined with each other and the configuration of the 3rd embodiment and the configuration of the 4th embodiment may be combined with each other.

REFERENCE SIGNS LIST

10, 10A, 10B, 10C, 10D, 10E, 10F, 10P: high-frequency amplifier circuit,
20, 20A, 20C, 20D, 20E, 20F1, 20F2, 20P: bias circuit,
21: voltage compensation circuit,
22: control voltage synchronous adjustment circuit
100: RFIC,
101, 1011, 1012: high-frequency amplifier,
102: bias control element (1st bias control element),
103: bias control element (2nd bias control element),
104, 104A: switch element,
501, 502: compensation control element,
511, 512: tuning control element,
201, 202, 203, 204, 205, 206, 211, 212: resistor,
301: coil,
401, 411, 421: capacitor,
901: input matching circuit,
902: output matching circuit,
903: interstage matching circuit,
Pin: RF input terminal,
Pout: RF output terminal,
$P_{VCC}$: driving voltage application terminal,
$P_{VC0}$: bias driving voltage application terminal,
$P_{VCTL}$: control voltage input terminal,
$P_{VLIN}$: bias current adjustment voltage application terminal,
$V_{CC}$: driving voltage,
$V_{C0}$: bias driving voltage,
$V_{CTL}$: control voltage,
$V_{LIN}$: bias current adjustment voltage

The invention claimed is:

1. A high-frequency amplifier circuit comprising:
a high-frequency amplifier that amplifies a high-frequency signal;
a bias circuit that supplies a bias current to the high-frequency amplifier; and
a control voltage input terminal that determines the bias current;
wherein the bias circuit includes
a 1st bias control element that supplies a 1st bias current to the high-frequency amplifier in accordance with the control voltage, a 2nd bias control element that supplies a 2nd bias current to the high-frequency amplifier in accordance with the control voltage, and a bias adjustment circuit that adjusts a potential difference between a 1st bias current output terminal of the 1st bias control element and a 2nd bias current output terminal of the 2nd, bias control element, wherein the bias adjustment circuit includes:

an impedance element connected between the 1st bias current output terminal of the 1st bias control element and the 2nd bias current output terminal of the 2nd bias control element, a switch circuit that sets the 2nd bias current output terminal to either of a 1st potential and a 2nd potential, which are different from each other, and a bias current adjustment voltage application terminal that applies a bias current adjustment voltage to the switch circuit.

2. The high-frequency amplifier circuit according to claim 1, wherein the switch circuit includes a switch element that is controlled to be on or off in accordance with the bias current adjustment voltage from the bias current adjustment voltage application terminal.

3. The high-frequency amplifier circuit according to claim 2, further comprising a control voltage synchronous adjustment circuit that adjusts an application voltage, which is based on the control voltage, applied to the 1st bias control element and the 2nd bias control element by using the bias current adjustment voltage.

4. The high-frequency amplifier circuit according to claim 2, wherein the high-frequency amplifier, the 1st bias control element, the 2nd bias control element and the switch element are npn transistors.

5. The high-frequency amplifier circuit according to claim 2, wherein the high-frequency amplifier, the 1st bias control element and the 2nd bias control element are npn transistors and the switch element is a field effect transistor.

6. The high-frequency amplifier circuit according to claim 1, wherein the impedance element is a resistor.

7. The high-frequency amplifier circuit according to claim 1, wherein the impedance element is a parallel circuit composed of a resistor and a capacitor.

8. The high-frequency amplifier circuit according to claim 1, further comprising a voltage compensation circuit that compensates an application voltage, which is based on the control voltage, applied to the 1st bias control element and the 2nd bias control element.

9. The high-frequency amplifier circuit according to claim 8, wherein the voltage compensation circuit is composed of a plurality of compensation control elements cascade connected with each other between an application point of the control voltage of the 1st bias control element and the 2nd bias control element and the ground.

10. A high-frequency amplifier circuit comprising:

a high-frequency amplifier that amplifies a high-frequency signal;

a bias circuit that supplies a bias current to the high-frequency amplifier; and a control voltage input terminal that determines the bias current;

wherein the bias circuit includes a 1st bias control element that supplies a 1st bias current to the high-frequency amplifier in accordance with the control voltage, a 2nd bias control element that supplies a 2nd bias current to the high-frequency amplifier in accordance with the control voltage, and a bias adjustment circuit that adjusts a potential difference between a 1st bias current output terminal of the 1st bias control element and a 2nd bias current output terminal of the 2nd bias control element wherein a parallel circuit composed of a capacitor and a resistor is connected to a side of a connection point of the high-frequency amplifier and the bias circuit, a high-frequency signal being input at the side of the connection point.

11. The high-frequency amplifier circuit according to claim 1, wherein the high-frequency amplifier is connected in a plurality of stages, and each of the plurality of stages of the high-frequency amplifier comprises the bias circuit.

12. The high-frequency amplifier circuit according to claim 2, wherein the impedance element is a resistor.

13. The high-frequency amplifier circuit according to claim 3, wherein the impedance element is a resistor.

14. The high-frequency amplifier circuit according to claim 4, wherein the impedance element is a resistor.

15. The high-frequency amplifier circuit according to claim 5, wherein the impedance element is a resistor.

16. The high-frequency amplifier circuit according to claim 2, wherein the impedance element is a parallel circuit composed of a resistor and a capacitor.

17. The high-frequency amplifier circuit according to claim 3, wherein the impedance element is a parallel circuit composed of a resistor and a capacitor.

18. The high-frequency amplifier circuit according to claim 4, wherein the impedance element is a parallel circuit composed of a resistor and a capacitor.

19. The high-frequency amplifier circuit according to claim 5, wherein the impedance element is a parallel circuit composed of a resistor and a capacitor.

* * * * *